(12) United States Patent
Barrett et al.

(10) Patent No.: US 8,099,562 B2
(45) Date of Patent: Jan. 17, 2012

(54) SCALABLE INTERFACE FOR A MEMORY ARRAY

(75) Inventors: Wayne M. Barrett, Rochester, MN (US); Todd A. Greenfield, Rochester, MN (US); Gene Leung, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 666 days.

(21) Appl. No.: 11/970,692

(22) Filed: Jan. 8, 2008

(65) Prior Publication Data

US 2009/0177813 A1    Jul. 9, 2009

(51) Int. Cl.
*G06F 12/00* (2006.01)

(52) U.S. Cl. ........... 711/151; 711/150; 711/158; 710/39

(58) Field of Classification Search .................. None
See application file for complete search history.

(56) References Cited

U.S. PATENT DOCUMENTS

| 7,003,637 B2 * | 2/2006 | Jiang et al. ............... 711/151 |
| 2008/0072006 A1 * | 3/2008 | Seo et al. ................... 711/167 |

* cited by examiner

*Primary Examiner* — Matthew Bradley
*Assistant Examiner* — Alan Otto
(74) *Attorney, Agent, or Firm* — Dillon & Yudell LLP

(57) ABSTRACT

A technique for accessing a memory array includes receiving, from multiple requesters, memory access requests directed to a single port of the memory array. The memory access requests associated with each of the multiple requesters are serviced, based on a priority assigned to each of the multiple requesters, while maintaining a fixed timing for the memory access requests.

16 Claims, 6 Drawing Sheets

SCALABLE INTERFACE FOR A MEMORY ARRAY

BACKGROUND

1. Field

This disclosure relates generally to a memory array and, more specifically, to a scalable interface for a memory array.

2. Related Art

Traditionally, memory array libraries have been created that include memory arrays with a different number of physical read and write ports. For example, a standard memory array library may include: a first memory array having one read port and one write port; a second memory array having two read ports and one write port; a third memory array having one read port and two write ports; and a fourth memory array having two read ports and two write ports. In this case, when a new application has required a memory array with more that two read ports or two write ports, a new custom memory array has generally been designed for the new application. Unfortunately, designing a custom memory array that supports a desired number of simultaneous memory accesses can be time-consuming and relatively expensive.

To avoid the expense associated with designing a custom memory array, at least some designers have selected an existing memory array (that does not include a desired number of physical read or write ports) from a memory array library and designed collision avoidance logic to facilitate access to the memory array (by multiple requesters) via a shared port of the memory array. In this case, a handshaking protocol (that indicates read and/or write completion) has been employed in conjunction with the collision avoidance logic to allow different requesters to access the memory array using the shared port (e.g., a read port and/or a write port). Unfortunately, the collision avoidance approach only facilitates sequential port access and generally exhibits non-fixed timing for accesses (e.g., an initial read may take four cycles and subsequent reads may take more or less than four cycles) and may adversely affect memory array function, as well as memory array performance. To avoid the expense associated with designing a custom memory array, at least some designers have implemented redundant memory arrays to provide simultaneous access to information associated with a single port of a memory array to multiple requesters. However, implementation of redundant memory arrays increases an area of an associated integrated circuit (IC) and also requires implementation of a coherency scheme to ensure that the same information is maintained in the redundant memory arrays.

SUMMARY

According to one aspect of the present disclosure, a method of accessing a memory array includes receiving, from multiple requesters, memory access requests directed to a single port of the memory array. The memory access requests associated with each of the multiple requesters are serviced, based on a priority assigned to each of the multiple requesters, while maintaining a fixed timing for the memory access requests.

According to another aspect of the present disclosure, a memory includes a memory array and an interface coupled to the memory array. The interface includes a first circuit that is configured to receive, from multiple requesters, memory access requests directed to a single port of the memory array. A first portion of the interface is clocked with a first clock signal, a second portion of the interface is clocked with a second clock signal, and the memory array is clocked with the second clock signal. A frequency of the second clock signal is higher than a frequency of the first clock signal and the memory access requests have a fixed timing.

According to one embodiment of the present disclosure, a technique for accessing a memory includes receiving, at an interface, memory access requests directed to a single port of a memory array. In this case, the memory access requests are each associated with multiple requestors. The memory access requests associated with each of the multiple requestors are serviced. A first portion of the interface is clocked with a first clock signal, a second portion of the interface is clocked with a second clock signal, and the memory array is clocked with the second clock signal. A frequency of the second clock signal is higher than a frequency of the first clock signal and the memory access requests have a fixed timing.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

Figure 1:
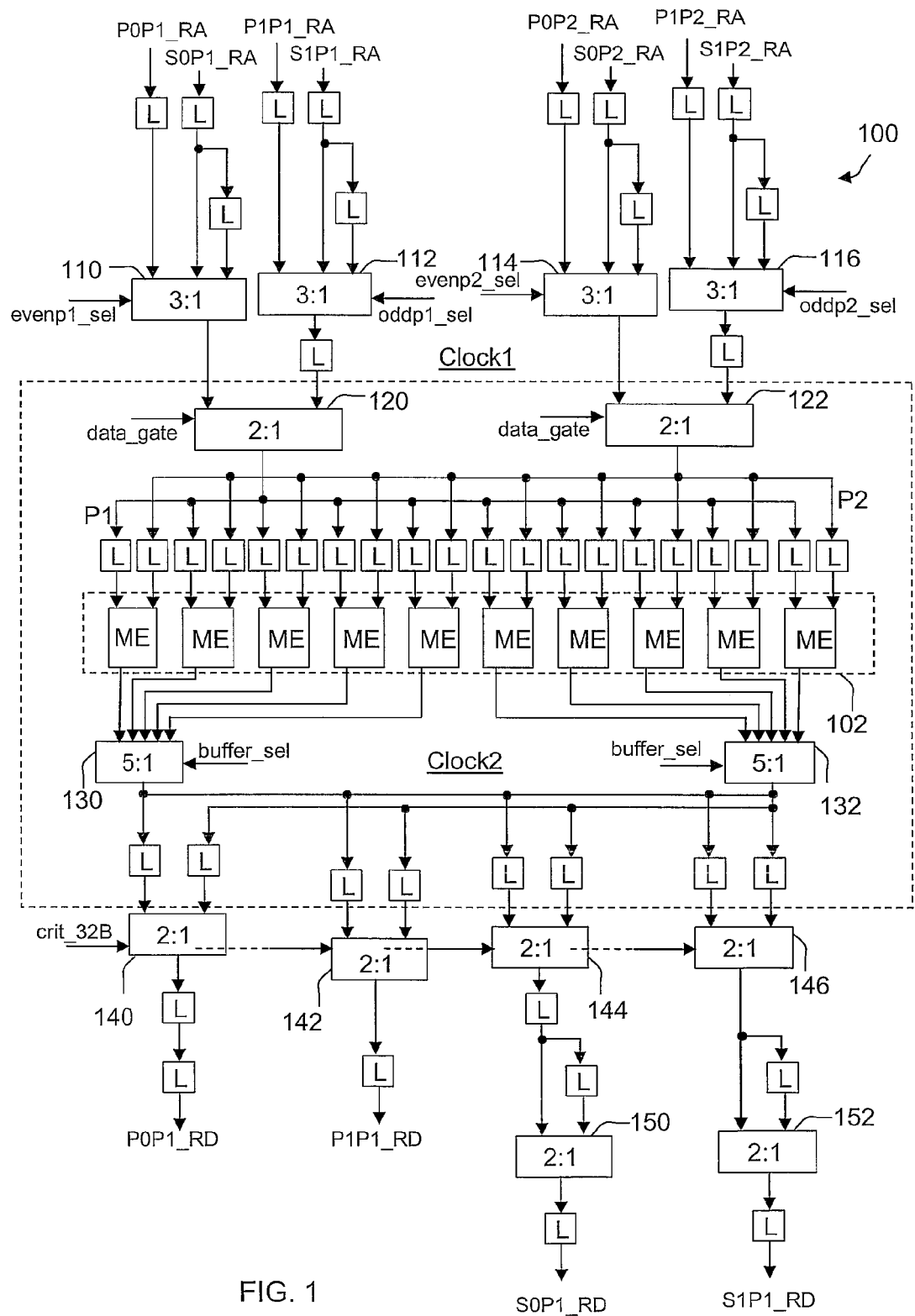
FIG. 1 is a block diagram of a relevant portion of an example read section of a memory array interface, configured according to the present disclosure.

As will be appreciated by one of ordinary skill in the art, the present invention may be embodied as a method, system, device, or computer program product. Accordingly, the present invention may take the form of an entirely hardware embodiment, an entirely software embodiment or an embodiment combining software and hardware aspects that may all generally be referred to herein as a "circuit," "module," or "system." For example, the present invention may take the form of one or more design files included on a computer-usable storage medium.

Any suitable computer-usable or computer-readable storage medium may be utilized. The computer-usable or computer-readable storage medium may be, for example, but is not limited to an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM) or Flash memory, a portable compact disc read-only memory (CD-ROM), an optical storage device, or a magnetic storage device. Note that the computer-usable or computer-readable storage medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable storage medium may be any medium that can contain or store a program for use by or in connection with an instruction execution system, apparatus, or device. As used herein, the term "coupled" includes both a direct electrical connection between blocks or components and an indirect electrical connection between blocks or components achieved using intervening blocks or components.

According to various aspects of the present disclosure, a memory array interface is described herein that is scalable and that maintains fixed and ascertainable timings (i.e., read and/or write latency can be readily determined) while providing multiple requesters access to a single read port or a single write port of a memory array, irrespective of the number of the multiple requesters. While the memory array described herein includes two read ports and two write ports, it should be appreciated that the disclosed techniques are applicable to memory arrays having more or less than two read ports and more or less than two write ports. Moreover, the disclosed techniques are broadly applicable to a wide variety of memory arrays, such as embedded dynamic random access memory (EDRAM), synchronous dynamic random access memory (SDRAM), and register arrays. Furthermore, a memory array interface configured according to the present disclosure may be employed in various devices, such as an application specific integrated circuit (ASIC), a processor, or a memory controller. According to various aspects of the present disclosure, a memory array interface is disclosed that facilitates multiple requesters accessing a single port of a memory array while maintaining fixed ascertainable timings.

According to one embodiment, the multiple requesters are divided into primary requesters and secondary requesters. When the memory array is incorporated within a memory controller, the primary requestor(s) may correspond to, for example, main memory and the secondary requestor(s) may correspond to, for example, a joint test action group (JTAG) interface. A memory array interface and associated memory array may be, for example, integrated in a Northbridge. In one disclosed embodiment, each physical port of a memory array has four associated virtual ports (i.e., two primary ports and two secondary ports). In this case, one of the primary ports may be accessed on a high pulse of a clock1 signal cycle and the remaining one of the primary ports may be accessed on a low pulse of the clock1 signal cycle. Similarly, one of the secondary ports may be accessed on a high pulse of a clock1 signal cycle and the remaining one of the secondary ports may be accessed on a low pulse of the clock1 signal cycle. In general, additional requesters may be added by including one or more additional buffers. For example, in the disclosed embodiment, each additional four requesters for a given port requires an additional clocked buffer.

In at least one embodiment, information (read addresses or write addresses and write data) is provided by the multiple requesters according to the clock1 signal, which in one embodiment has a frequency that is one-half the frequency of a clock2 signal that clocks memory elements of a memory array. For example, a frequency of the clock2 signal may be 400 MHz and a frequency of the clock1 signal may be 200 MHz. It should be appreciated that the clock1 and clock2 signal frequencies may have a different relationship, depending upon the structure of the memory array interface. For example, four requesters may be serviced by each port of a memory array by providing a clock2 signal frequency that is two times a clock1 signal frequency, eight requesters may be serviced by each port of a memory array by providing a clock2 signal frequency that is four times a clock1 signal frequency, and twelve requesters may be serviced by each port of a memory array by providing a clock2 signal frequency that is eight times a clock1 signal frequency.

With reference to FIG. 1, a relevant portion of an example read section 100 of a memory array interface is illustrated. The read section 100 is essentially a prioritized pipeline. As is shown, read addresses (i.e., P0P1_RA, P1P1_RA, S0P1_RA, and S1P1_RA) for four requesters (i.e., P0P1, P1P1, S0P1, and S1P1) are provided to a first port (P1) of a memory array 102. It should be appreciated that a width of a read address line depends on the number of memory elements (ME) that are to be accessed. For example, assuming that thirty-two memory elements are implemented, five read address lines may be employed ($2^5=32$). In one embodiment, two-stage latches or clocked buffers (L) are employed on each of the read address lines. Multiplexers 110, 112 and 120 are employed to select which of the multiple requesters provides a read address to the memory array 102 on read port P1. More specifically, the multiplexer 110 selects (based on a control signal (evenp1_sel) when the clock1 signal is high) whether the '0' requestor P0P1, S0P1, or a delayed S0P1 is selected to provide a read address to a first input of the multiplexer 120. The multiplexer 112 selects (based on a control signal (oddp1_sel) when the clock1 signal is low) whether the '1' requestor P1P1, S1P1, or a delayed S1P1 is selected to provide a read address to a second input of the multiplexer 120. Which of the requesters is selected by the control signals evenp1_sel and oddp1_sel is based on a priority scheme employed. The multiplexer 120 selects (based on a select signal (data_gate), which passes '0' requesters on even clock2 signal cycles and passes '1' requesters on odd clock2 signal cycles) whether the read address provided by the multiplexer 110 or the multiplexer 112 is provided to the read port P1 of the memory array 102.

As is also shown, read addresses (i.e., P0P2_RA, P1P2_RA, S0P2_RA, and S1P2_RA) for four requesters (P0P2, P1P2, S0P2, and S1P2) are provided to a second port (P2) of the memory array 102. As noted above, in the disclosed embodiment, two-stage latches (L) are employed on each of the read address lines. Multiplexers 114, 116, and 122 are employed to select which of the multiple requesters provides a read address to the memory array 102 on the read port P2. More specifically, the multiplexer 114 selects (based on a control signal (evenp2_sel) when the clock1 signal is high) whether the '0' requestor P0P2, S0P2, or a delayed S0P2 is selected to provide a read address to a first input of the multiplexer 122. The multiplexer 114 selects (based on a control signal (oddp2_sel) when the clock1 signal is low) whether the '1' requestor P1P2, S1P2, or a delayed S1P2 is selected to provide a read address to a second input of the multiplexer 122. Which of the requesters is selected by the control signals evenp2_sel and oddp2_sel is also based on the employed priority scheme. The multiplexer 122 selects (based on a select signal (data_gate), which passes '0' requesters on even clock2 signal cycles and passes '1' requesters on odd clock2 signal cycles) whether the read address provided by the multiplexer 114 or the multiplexer 116 is provided to the read port P2 of the memory array 102.

Figure 3:
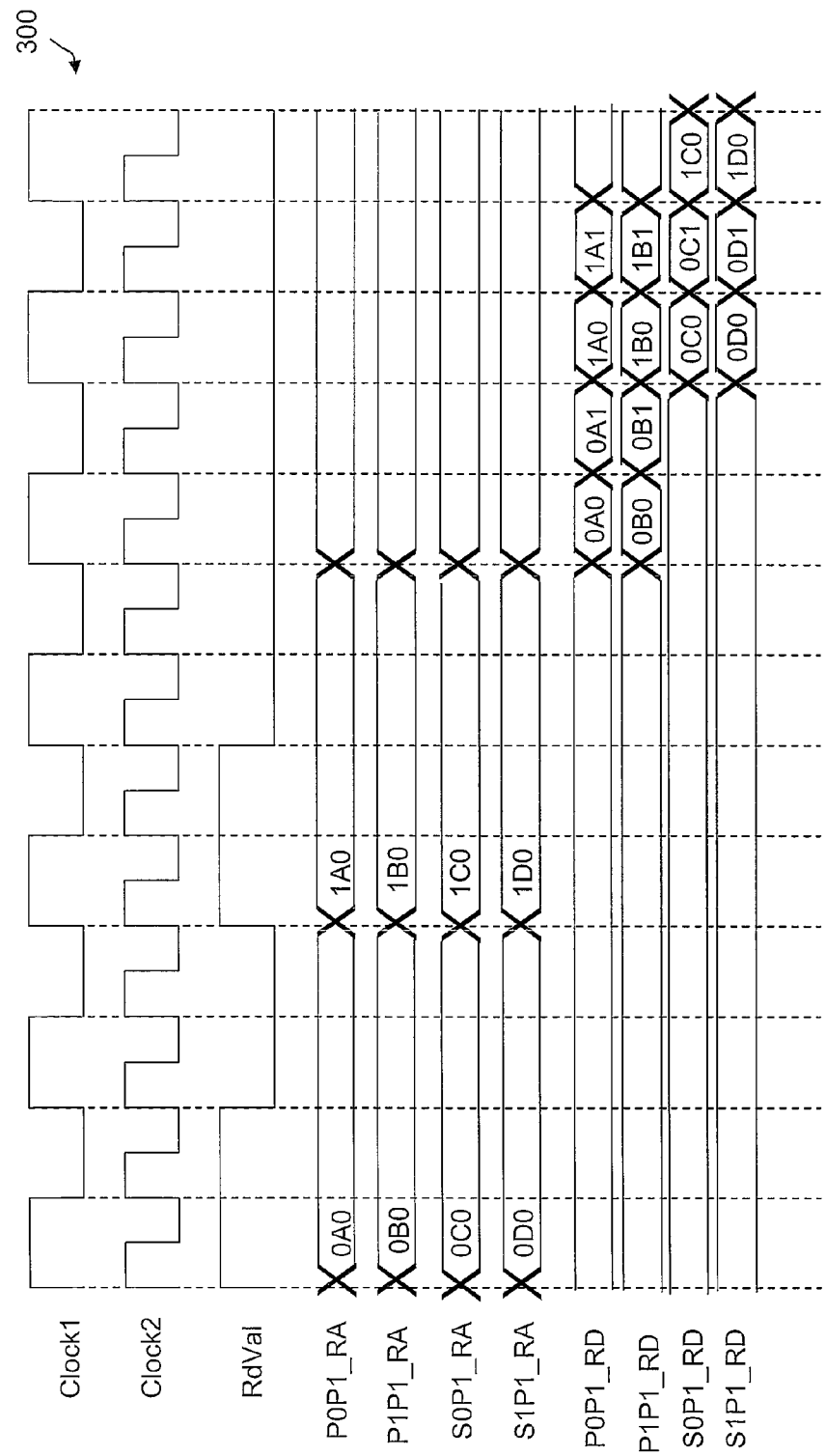
FIG. 3 is an example timing diagram for the read section of the memory array interface of FIG. 1.

Similar to how a read address is directed to a read port of the memory array 102 via a first multiplexer and latch structure, read data exits the memory array 102 via a second multiplexer and latch structure that is configured to maintain an order of the read data. For simplicity, only the circuitry that is applicable to the read port P1 is illustrated. More specifically, multiplexers 130 and 132 select (based on a control signal (buffer_sel)) a memory element from which to read data from the memory array 102. Secondary read data is staged to exit the interface a single clock1 cycle later than primary read data. Multiplexers 140, 142, 144, and 146 receive a control signal (crit_32b) that orders bytes of read data as the read data exits the memory array 102. For example, a sixty-four byte line would include a high-order thirty-two bytes and a low-order thirty-two bytes that are provided in alternate clock1 cycles. It should be appreciated that the techniques disclosed herein may be applied to a memory array in which a line of memory is read out of the memory array in a single clock1 cycle. Multiplexers 150 and 152 select whether secondary read data (S0P1_RD or S1P1_RD) or delayed secondary read data is provided to a secondary requester. FIG. 3 depicts an example timing diagram 300 that illustrates four simultaneous accesses on the same physical read port (i.e., port P1) and the availability of data at an output of the interface 100. As is illustrated, a valid signal (RdVal) indicates when a read address is valid. While only one valid signal is illustrated, it should be appreciated that in a typical implementation each requestor provides a respective valid signal in conjunction with a respective read address. In the diagram 300, the addresses (e.g., address 0A0 and 1A0) are different example addresses for a requestor (i.e., P0P1).

Figure 2:
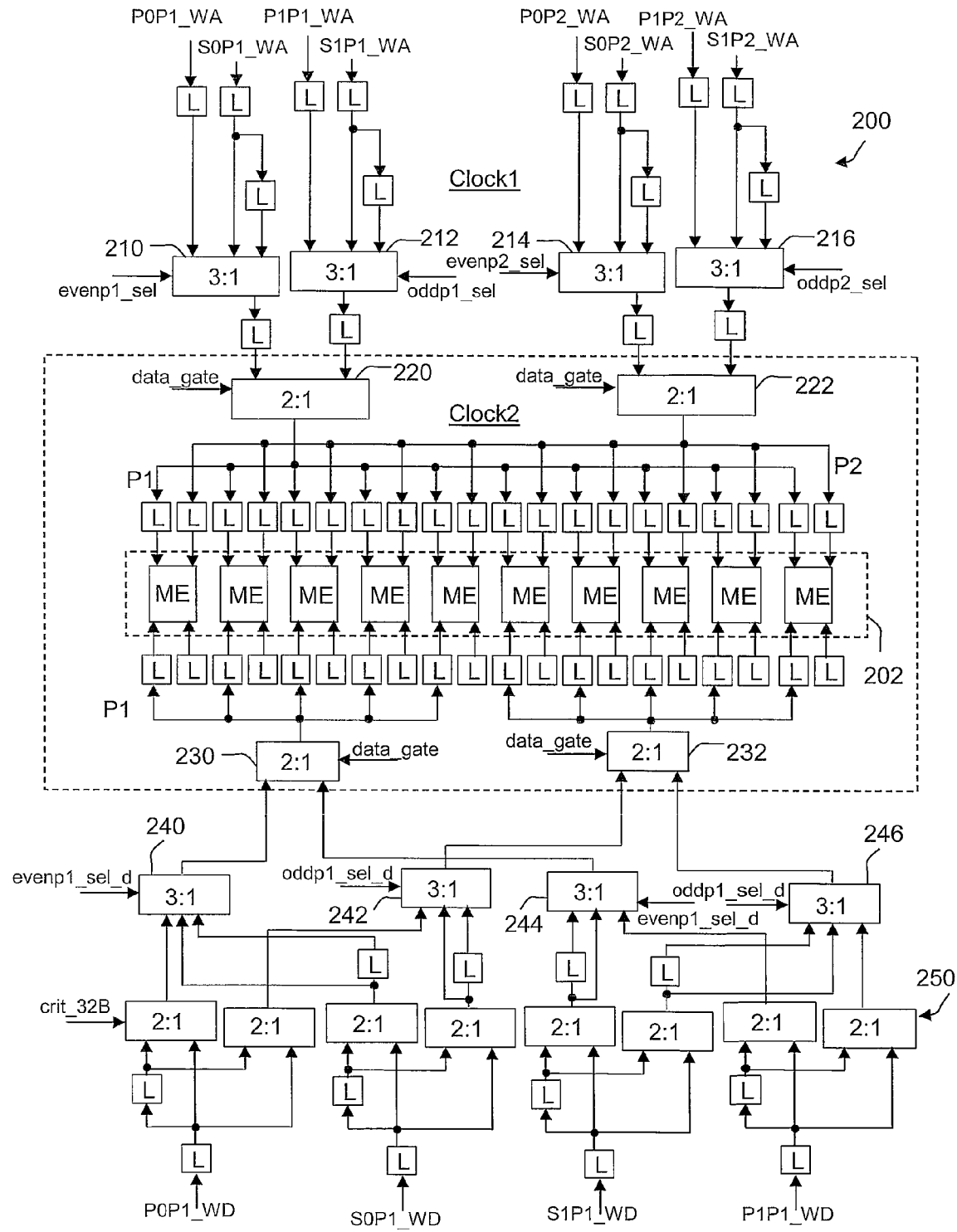
FIG. 2 is a block diagram of a relevant portion of an example write section of a memory array interface, configured according to the present disclosure.

With reference to FIG. 2, a relevant portion of an example write section 200 of a memory array interface is illustrated. The write section 200 is also essentially a prioritized pipeline. As is shown, write addresses (i.e., P0P1_WA, P1P1_WA, S0P1_WA, and S1P1_WA) for four requesters (P0P1, P1P1, S0P1, and S1P1) are provided to a first port (P1) of a memory array 202. It should be appreciated that a width of a write address line depends on the number of memory elements (ME) that are to be accessed. For example, assuming that thirty-two memory elements are implemented, five write address lines may be employed ($2^5$=32). In one embodiment, two-stage latches or clocked buffers (L) are employed on each of the write address lines as illustrated. Multiplexers 210, 212, and 220 are employed to select which of the multiple requesters provides a write address to the memory array 202 on write port P1. More specifically, the multiplexer 210 selects (based on a control signal (evenp1_sel) when the clock1 signal is high) whether the '0' requestor P0P1, S0P1, or a delayed S0P1 is selected to provide a write address to a first input of the multiplexer 220. The multiplexer 212 selects (based on a control signal (oddp1_sel) when the clock1 signal is low) whether the '1' requester P1P1, S1P1, or a delayed S1P1 is selected to provide a write address to a second input of the multiplexer 220. Which of the requesters is selected by the control signals evenp1_sel and oddp1_sel is based on a priority scheme employed. The multiplexer 220 selects (based on a select signal (data_gate), which passes '0' requesters on even clock2 signal cycles and passes '1' requesters on odd clock2 signal cycles) whether the write address provided by the multiplexer 210 or the multiplexer 212 is provided to the write port P1 of the memory array 202.

As is also shown, write addresses (i.e., P0P2_WA, P1P2_WA, S0P2_WA, and S1P2_WA) for four requesters (i.e., P0P2, P1P2, S0P2, and S1P2) are provided to a second port (P2) of the memory array 202. As noted above, in the disclosed embodiment, two-stage latches (L) are employed on each of the write address lines. Multiplexers 214, 216, and 222 are employed to select which of the multiple requesters provides a write address to the memory array 202 on the write port P2. More specifically, the multiplexer 214 selects (based on a control signal (evenp2_sel) when the clock1 signal is high) whether the '0' requester P0P2, S0P2, or a delayed S0P2 is selected to provide a write address to a first input of the multiplexer 222. The multiplexer 214 selects (based on a control signal (oddp2_sel) when the clock1 signal is low) whether the '1' requester P1P2, S1P2, or a delayed S1P2 is selected to provide a write address to a second input of the multiplexer 222. Which of the requesters is selected by the control signals evenp2_sel and oddp2_sel is also based on the employed priority scheme. The multiplexer 222 selects (based on a select signal (data_gate), which passes '0' requesters on even clock2 signal cycles and passes '1' requesters on odd clock2 signal cycles) whether the write address provided by the multiplexer 214 or the multiplexer 216 is provided to the write port P2 of the memory array 202.

Similar to how a write address is directed to a write port of the memory array 202 via a first multiplexer and latch structure, write data enters the memory array 202 via a second multiplexer and latch structure that is configured to maintain an order of the write data. For simplicity, only circuitry that is applicable to the write port P1 is illustrated. More specifically, multiplexers 250 receive a control signal (crit_32b) that orders bytes of write data for writing to the memory array 202. Multiplexers 240, 242, 244, and 246 are employed to select which of the multiple requesters provides write data to the memory array 202 on the write port P2. More specifically, the multiplexer 240 selects (based on a control signal (evenp1_sel_d) when the clock1 signal is high) whether the '0' requestor P0P1, S0P1, or a delayed S0P1 is selected to provide write data to a first input of multiplexer 230. The multiplexer 244 selects (based on a control signal (oddp1_sel_d) when the clock1 signal is low) whether the '1' requestor P1P1, S1P1, or a delayed S1P1 is selected to provide write data to a second input of the multiplexer 230. Which of the requesters is selected by the control signals evenp1_sel_d and oddp1_sel_d is also based on the employed priority scheme. The multiplexer 230 selects (based on a select signal (data_gate), which passes '0' requesters on even clock2 signal cycles and passes '1' requesters on odd clock2 signal cycles) whether the write data provided by the multiplexer 240 or the multiplexer 244 is provided to the write port P2 of the memory array 202.

Figure 4:
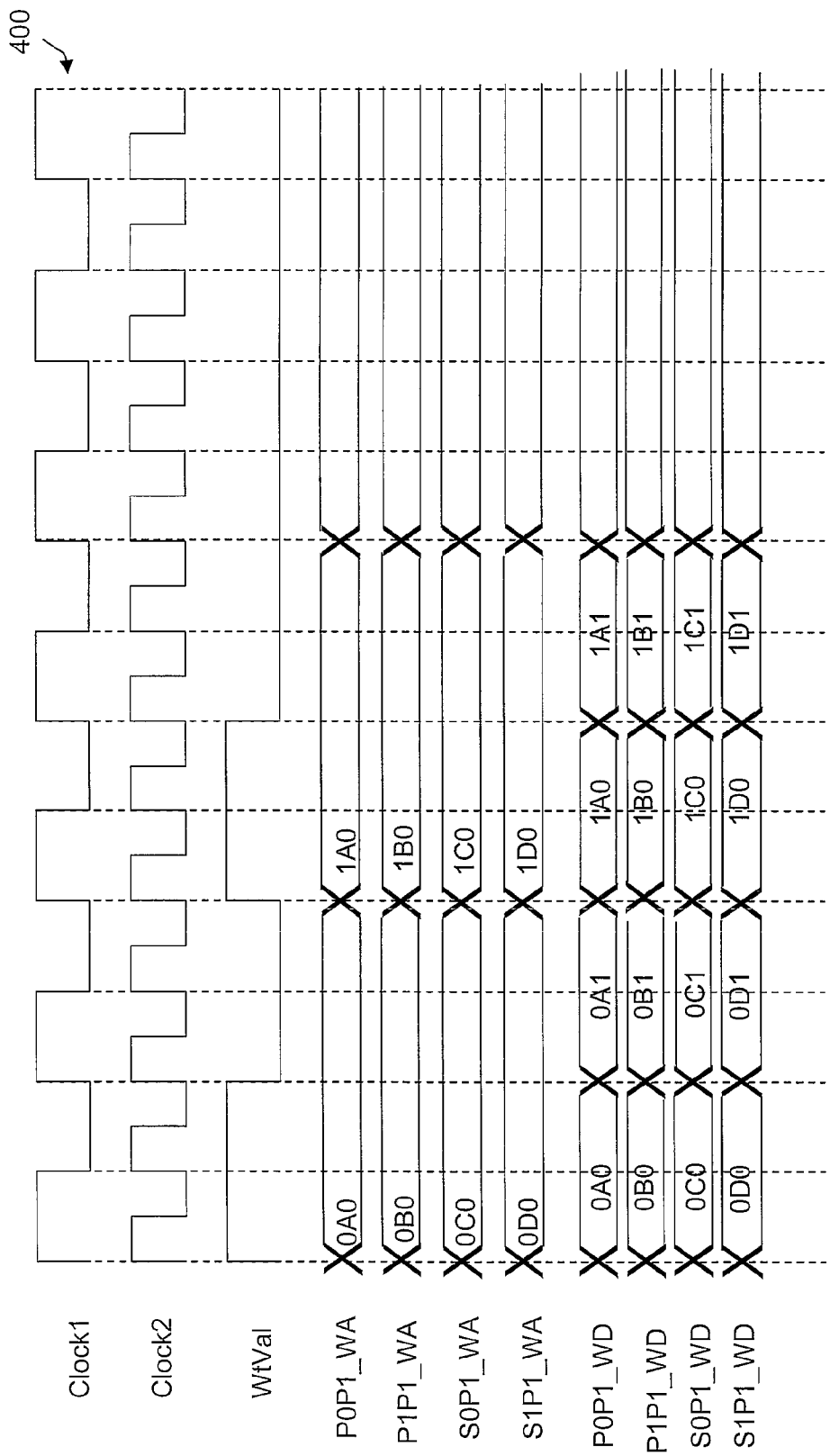
FIG. 4 is an example timing diagram for the write section of the memory array interface of FIG. 2.

The multiplexer 242 selects (based on the control signal (oddp1_sel_d) when the clock1 signal is low) whether the '0' requestor P0P1, S0P1, or a delayed S0P1 is selected to provide write data to a first input of the multiplexer 232. The multiplexer 246 selects (based on the control signal (oddp1_sel_d) when the clock1 signal is low) whether the '1' requestor P1P1, S1P1, or a delayed S1P1 is selected to provide write data to a second input of multiplexer 232. Which of the requesters is selected by the control signals evenp1_sel_d and oddp1_sel_d is also based on the employed priority scheme. In the disclosed embodiment, the evenp1_sel_d clock signal corresponds to the evenp1_sel signal delayed by one clock1 cycle and the oddp1_sel_d clock signal corresponds to the oddp1_sel signal delayed by one clock1 cycle. The multiplexer 232 selects (based on a select signal (data_gate), which passes '0' requesters on even clock2 signal cycles and passes '1' requesters on odd clock2 signal cycles) whether the write data provided by the multiplexer 242 or the multiplexer 246 is provided to the write port P1 of the memory array 202. FIG. 4 depicts an example timing diagram 400 that illustrates four simultaneous accesses on the same physical write port (i.e., port P1). As is illustrated, a valid signal (WtVal) indicates when a write address is valid. While only one valid signal is illustrated, it should be appreciated that in a typical implementation each requestor provides a respective valid signal in conjunction with a respective write address. In the diagram 400, the addresses (e.g., address 0A0 and 1A0) are different example addresses for a requestor (e.g., P0P1). As is illustrated, a low-order thirty-two bytes (0A0) is written in one clock1 cycle and a high-order thirty-two bytes (0A1) is written in a next clock1 cycle for the requestor P0P1.

Figure 5:
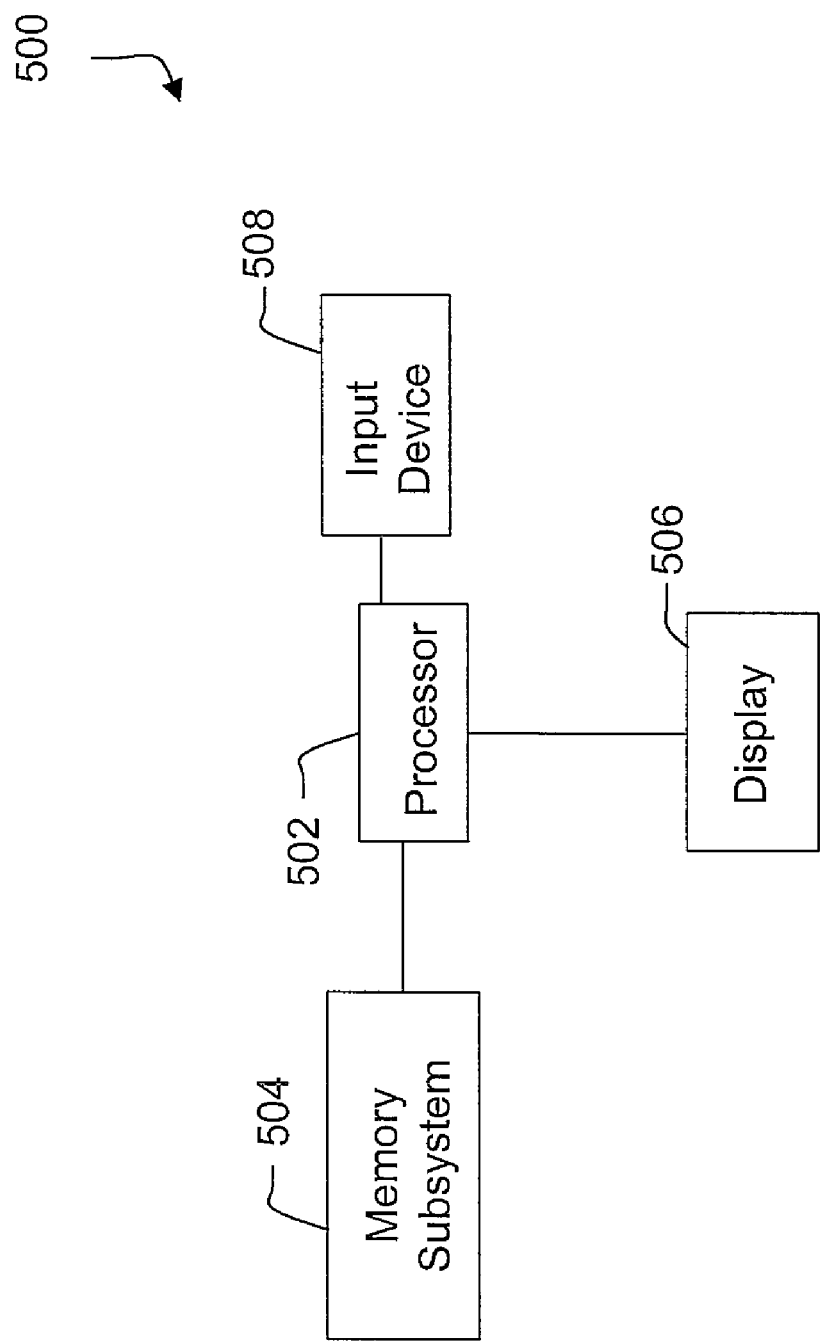
FIG. 5 is a block diagram of an example computer system that may be configured to include one or more memory arrays having a memory array interface configured according to FIGS. 1 and 2.

With reference to FIG. 5, an example computer system 500 is illustrated that may include one or more circuits that employ one or more memory arrays configured according to various embodiments of the present disclosure. The computer system 500 includes a processor 502 that is coupled to a memory subsystem 504, a display 506, and an input device 508. The processor 502 may include one or more memory arrays configured according to the present disclosure. The memory subsystem 504 includes an application appropriate amount of volatile memory (e.g., dynamic random access memory (DRAM)) and non-volatile memory (e.g., read-only memory (ROM)). The display 506 may be, for example, a cathode ray tube (CRT) or a liquid crystal display (LCD). The input device 508 may include, for example, a mouse and a keyboard. The processor 502 may also be coupled to one or more mass storage devices, e.g., a compact disc read-only memory (CD-ROM) drive.

Figure 6:
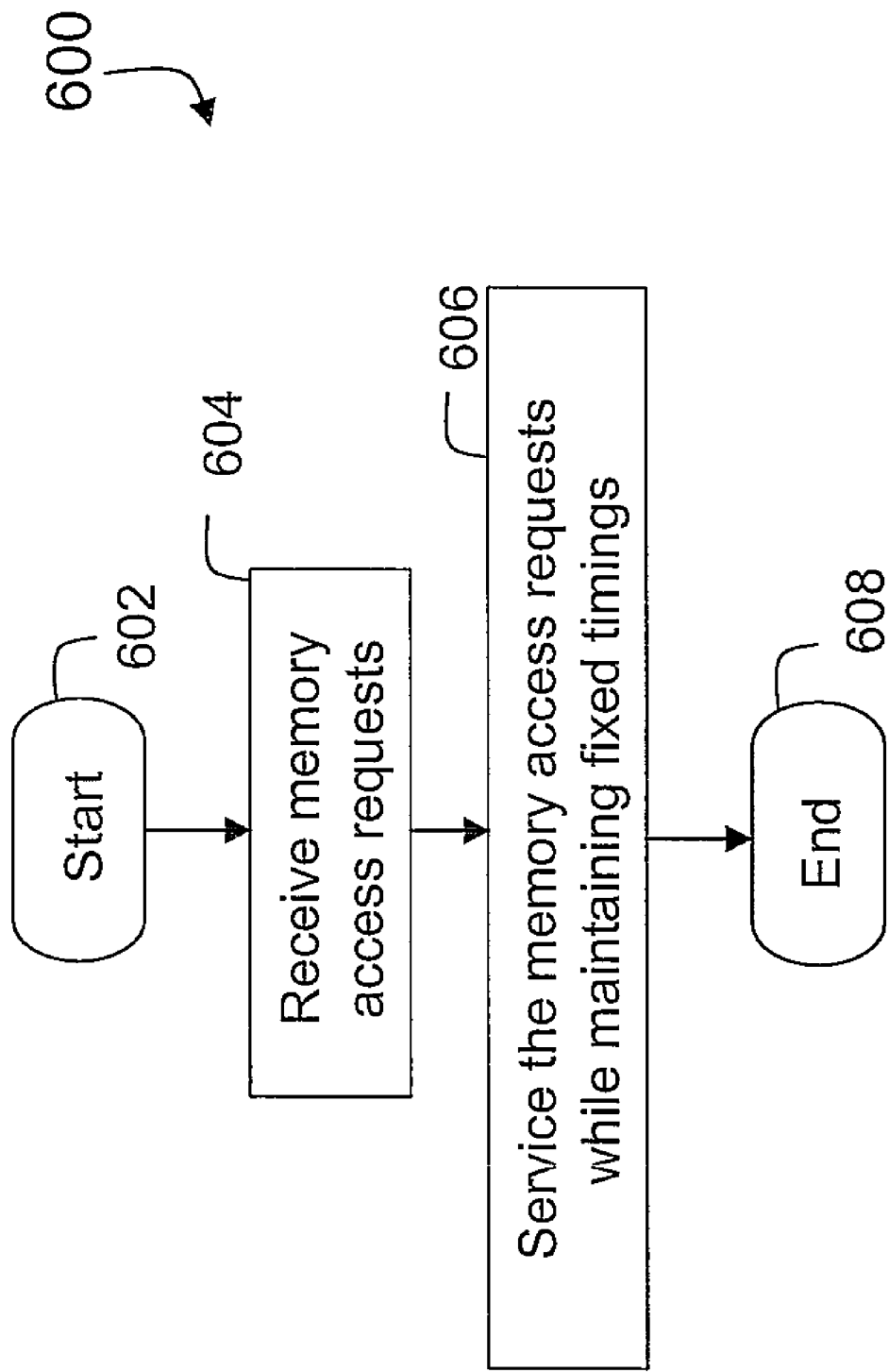
FIG. 6 is a flowchart of a process for operating a memory array interface configured according to an embodiment of the present disclosure.

With reference to FIG. 6, an example process 600 for operating a memory array, according to an embodiment of the present disclosure, is illustrated. In block 602, the process 600 is initiated at which point control transfers to block 604. In block 604, memory access requests (i.e., read or write requests) are received by a memory array interface from multiple requesters. Next, in block 606, the memory access requests are serviced by the interface while maintaining a fixed timing. The memory access requests may be serviced in an order that is based on a priority assigned to each of the multiple requesters. In various embodiments, a first portion of the interface is clocked with a first clock signal, a second portion of the interface is clocked with a second clock signal, and the memory array is clocked with the second clock signal. In this case, a frequency of the second clock signal is higher than a frequency of the first clock signal. Following block 606, control transfers to block 608, where the process 600 terminates.

Accordingly, a memory array interface has been described herein that is scalable and that maintains fixed and predictable timings (i.e., read and/or write latency can be readily determined). The memory array interface may be configured to provide multiple requesters access to a single read port or a single write port of a memory array, irrespective of the number of the multiple requesters.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method of accessing a memory array, comprising:
receiving, from multiple requesters, memory access requests directed to a single port of the memory array;
servicing the memory access requests associated with each of the multiple requesters, based on a priority assigned to each of the multiple requesters, while maintaining a fixed timing for the memory access requests by;
receiving, at the single port, a first address from a first one of the multiple requesters having a highest priority of the multiple requesters included in a first group during a high portion of a first clock cycle of a first clock signal; and
receiving at the single port, a second address from a second one of the multiple requesters having a highest priority of the multiple requesters included in a second group during a low portion of the first clock cycle of the first clock signal, wherein the first and second groups include different ones of the multiple requesters.

2. The method of claim 1, wherein the single port is a write port, the first address is a first write address, and the second address is a second write address.

3. The method of claim 2, further comprising:
accumulating multiple bytes of write data for the first one of the multiple requesters over multiple cycles of the first clock signal; and
writing the multiple bytes of write data to a single line of the memory array in multiple cycles of the second clock signal, wherein a frequency of the second clock signal is higher than a frequency of the first clock signal.

4. The method of claim 3, wherein the frequency of the second clock signal is two times the frequency of the first clock signal.

5. The method of claim 1, wherein the single port is a read port, the first address is a first read address, and the second address is a second read address.

6. The method of claim 5, further comprising:
reading multiple bytes of read data in multiple cycles of a second clock signal, wherein a frequency of the second clock signal is higher than a frequency of the first clock signal and the read data is associated with the first read address.

7. The method of claim 6, wherein the frequency of the second clock signal is two times a frequency of the first clock signal.

8. The method of claim 1, wherein the memory access requests are read requests or write requests.

9. A memory, comprising:
a memory array; and
an interface coupled to the memory array, wherein the interface includes a first circuit that is configured to receive, from multiple requestors, memory access requests directed to a single port of the memory array and service the memory access requests in an order that is based on an assigned priority of the multiple requestors by:
receiving a first address from a first one of the multiple requestors having a highest priority of the multiple requestors included in a first group during a high portion of a first clock cycle of a first clock signal; and
receiving a second address from a second one of the multiple requestors having a highest priority of the multiple requestors included in a second group during a low portion of the first clock cycle of the first clock signal, wherein the first and second groups included different ones of the multiple requestors, and wherein a first portion of the interface is clocked with a first clock signal, a second portion of the interface is clocked with a second clock signal, and the memory array is clocked with the second clock signal, where a frequency of the second clock signal is higher than a frequency of the first clock signal and the memory access requests have a fixed timing.

10. The memory of claim 9, wherein the single port is a write port, the first address is a first write address. and the second address is a second write address.

11. The memory of claim 10, wherein the interface further includes a second circuit that is configured to accumulate multiple bytes of write data for the first one of the multiple requestors over multiple cycles of the first clock signal and write the multiple bytes of write data to a single line of the memory array in multiple cycles of the second clock signal.

12. The memory of claim 11, wherein the frequency of the second clock signal is two times the frequency of the first clock signal.

13. The memory of claim 9, wherein the single port is a read port, the first address is a first read address, and the second address is a second read address.

14. The memory of claim 13, further comprising:
a second circuit configured to read multiple bytes of read data in multiple cycles of the second clock signal, wherein the read data is associated with the first read address.

15. The memory of claim 14, wherein the frequency of the second clock signal is two times a frequency of the first clock signal.

16. The memory of claim 9, wherein the memory access requests are read requests or write requests.

* * * * *